US008527256B2

(12) United States Patent
Wu

(10) Patent No.: US 8,527,256 B2
(45) Date of Patent: Sep. 3, 2013

(54) EQUIVALENT CIRCUIT MODEL FOR MULTILAYER CHIP CAPACITOR, CIRCUIT CONSTANT ANALYSIS METHOD, PROGRAM, DEVICE, AND CIRCUIT SIMULATOR

(75) Inventor: Xiangying Wu, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 248 days.

(21) Appl. No.: 13/160,394

(22) Filed: Jun. 14, 2011

(65) Prior Publication Data
US 2011/0307235 A1   Dec. 15, 2011

(30) Foreign Application Priority Data

Jun. 15, 2010  (JP) ................. 2010-136335

(51) Int. Cl.
*G06G 7/50* (2006.01)
(52) U.S. Cl.
USPC .............................. 703/14; 706/1; 361/306.3
(58) Field of Classification Search
USPC .......................................................... 703/14
See application file for complete search history.

(56) References Cited

U.S. PATENT DOCUMENTS

| 7,003,744 | B2 * | 2/2006 | Weller et al. ................. 716/103 |
| 7,269,810 | B1 * | 9/2007 | Weller et al. ................. 716/115 |
| 7,788,079 | B2 * | 8/2010 | Wu et al. ........................ 703/14 |
| 2003/0173979 | A1 * | 9/2003 | Maeshima et al. ............ 324/649 |

FOREIGN PATENT DOCUMENTS

| JP | 2002-259482 A | 9/2002 |
| JP | 2005-339157 A | 12/2005 |
| JP | 2006-038704 A | 2/2006 |

OTHER PUBLICATIONS

Yamanaga, et al., "A Universal Equivalent Circuit Model for Ceramic Capacitors", IEICE Transactions on Electronics vol. E93-C No. 3 pp. 347-354, Publication Date Mar. 2, 2010.*
Gordon, et al., "A Substrate-Dependent CAD Model for Ceramic Multilayer Capacitors", IEEE Transactions on Microwave Theory and Techniques, vol. 48, No. 10, Oct. 2000.*
Kouno et al., "Parameter Extraction Methods for a Lumped Circuit Model," The Science and Engineering Review of Doshisha University, Jul. 2004, vol. 45, No. 2, pp. 1-14. Mentioned on paragraph Nos. 5 and 7-8 of the as-filed specification and English abstract included as a concise explanation of relevance.

* cited by examiner

*Primary Examiner* — Kamini S Shah
*Assistant Examiner* — Nabil A Adawi, Jr.
(74) *Attorney, Agent, or Firm* — Chen Yoshimura LLP

(57) ABSTRACT

Improved equivalent circuits and circuit analysis using the same for a multilayer capacitor are provided. In one aspect, the equivalent series capacitance C and part of the equivalent series resistance R of a basic equivalent circuit for a multilayer chip capacitor are replaced with a capacitance CO, and capacitances Cm and C1 and the resistance Rc1 to take into consideration abnormal characteristics in electromagnetic distribution that occur at the corners and edges of the internal electrodes in the multilayer chip capacitor. In one aspect, additional circuit elements, such as resistances Rp1 and Rp2, the capacitance Cp, the inductances Lm and L1, and the resistance RL1, are provided to take into consideration the skin effects of the internal electrodes within the multilayer chip capacitor, electromagnetic proximity effects, losses and parasitic capacitance of the dielectric material, as well as parasitic inductance of the external electrodes.

1 Claim, 7 Drawing Sheets

(A)

(B)

(C)

(A)

(B)

(C)

(A)

(B)

EQUIVALENT CIRCUIT MODEL FOR MULTILAYER CHIP CAPACITOR, CIRCUIT CONSTANT ANALYSIS METHOD, PROGRAM, DEVICE, AND CIRCUIT SIMULATOR

BACKGROUND OF THE INVENTION

1. Technical Field

The present invention relates to an equivalent circuit model of a multilayer chip capacitor (or condenser) and a circuit constant analysis method, program, device, and circuit simulator therein and relates to an improvement in the equivalent circuit model of the multilayer chip capacitor and the circuit constant analysis method, program, device, and circuit simulator therein that is preferred in characteristics simulation of the circuit which includes, for example, a multilayer chip capacitor that uses ceramics.

2. Background Art

Multilayer chip capacitors, and multilayer ceramic capacitors (MLCCs) in particular are widely used in electronic devices such as cellular telephones. These capacitors include a right-angled parallelepiped shape dielectric chip and a plurality of internal electrodes, each of which, along with being embedded in the above-stated chip, has one terminal pulled to the surface of the aforementioned chip as well as an external electrode formed on the surface of the aforementioned chip so as to make electric contact with the terminals of the aforementioned internal electrodes. The design and analysis of a circuit that utilizes a multilayer chip capacitor employs Simulation Program with Integrated Circuit Emphasis known as SPICE—an open source analogue electronic circuit simulator, for example, and as an equivalent circuit therefor, an ideal capacitor and/or a simple RLC series circuit shown in FIG. 1(A) are utilized. Due to the presence of parasitic components, however, it is impossible to represent the characteristics of the multilayer chip capacitor sufficiently in an ideal capacitor model. Moreover, when the RLC series circuit shown in FIG. 1(A) is used, since each of circuit elements is frequency dependent in actuality, significant errors would result, and the actual performance of the circuit designed this way would be quite different from the design target. Accordingly, various equivalent circuit models have been proposed for conducting more accurate simulation.

Patent Documents 1 through 3 below are herewith disclosed as background art related to equivalent circuit models for capacitors. Patent Document 1 is aimed at deriving an equivalent circuit model for a capacitor in time domain by a procedure that can be used regardless of types of capacitors. It first forms one of the RC, RL, and RCL circuits as an equivalent circuit model for the frequency characteristics the user input, and calculates evaluation functions to determine the accuracy of the model. The circuit constants are determined by minimizing the values of the evaluation functions.

In Patent Document 2, an equivalent circuit is structured such that the real part of the impedance of the equivalent circuit changes with the frequency of an applied AC signal in near conformity with the real part of the measured impedance of the actual circuit. Specifically, the proposed equivalent circuit includes a first circuit for a storage part and a second circuit for a terminal, which is connected in serious to the first circuit, wherein the first circuit includes at least one series circuit in which a first parallel circuit and a second parallel circuit are connected in series, and wherein the first parallel circuit includes a first resistance and a first inductance connected to the first resistance in parallel, and the second parallel circuit includes a second resistor and a capacitance connected in parallel to the second resistance. Patent Document 3 resembles the above-described Patent Document 2, and discloses an equivalent circuit model in which a series circuit of a resistance and a capacitance is additionally provided.

Furthermore, in Non-Patent Document 1 listed below, a circuit modeling technique is disclosed in which a fractional polynomial is factorized at every second order when performing the modeling of circuit elements, and a parallel connection of series resonance circuits or a series connection of parallel resonance circuits is utilized.

RELATED ART DOCUMENTS

Patent Documents

Patent Document 1: Japanese Patent Application Laid-Open Publication No. 2002-259482
Patent Document 2: Japanese Patent Application Laid-Open Publication No. 2005-339157
Patent Document 3: Japanese Patent Application Laid-Open Publication No. 2006-038704

Non-Patent Documents

Non-Patent Document 1: Michitaka KAWANO, Toshiji KATO, and Kaoru INOUE, "Parameter Extraction Methods for Lumped Constant Equivalent Circuits by the Least-Square Method," The Science and Engineering Review of Doshisha University, Vol. 45, No. 2, pp. 1-14, July 2004.

SUMMARY OF THE INVENTION

Problems to be Solved by the Invention

However, the characteristics gained by using equivalent circuit models such as those mentioned in the above-described patent documents do not sufficient reflect the characteristics of an actual multilayer chip capacitor, and when performing circuit design or the like with a circuit simulator, accurate prediction of characteristics in the desired frequency bandwidth is difficult. Moreover, the method of forming a circuit using general polynomial formulas as cited in the Non-Patent Document must increase the order of the polynomial expression in order to achieve higher accuracy, and the structure of the circuit ends up have a great deal of complexity.

The present invention focuses on the above aspects, and an object is to provide, in circuit design using a circuit simulator, an equivalent circuit model for a multilayer chip capacitor and a circuit constant analysis method, program, device, and circuit simulator, which are capable of suppressing errors accompanied by fluctuations in frequency between the targeted performance and the actual circuit performance.

Means for Solving the Problems

In order to attain the above-described objects, an equivalent circuit model of a multilayer chip capacitor according to one aspect of the present invention includes: a first parallel circuit connecting the capacitance C1 and the resistance Rc1 in parallel, which represent electromagnetic effects present in a dielectric contacting a respective upper surface of a plurality of internal electrodes of the multilayer chip capacitor and a dielectric contacting a respective upper surface of the plurality of internal electrodes; a first series circuit connecting the first parallel circuit and the a mutual capacitance Cm in series; a second parallel circuit connecting a parasitic capacitance Cp in the dielectric in parallel with an insulation resistance Rp2 that represents a loss in the dielectric; a second series circuit connecting the second parallel circuit in series to a resistance Rp1 that represents a loss in the dielectric; a third parallel circuit connecting the first series circuit, the second series circuit, and an electrostatic capacitance C0 in parallel to each other; a third series circuit connecting a inductance L1 and a resistance RL1 in series that respectively represent metal skin effects on the upper and lower surfaces, respectively, of the plurality of internal electrodes; a fourth parallel circuit connecting a mutual inductance Lm for electromagnetic proximity effects in parallel with the third series circuit; and a fourth series circuit connecting an electrode DC resistance Rs in series to the third parallel circuit, the fourth parallel circuit, and to an electrode parasitic inductance Ls.

The equivalent circuit model of the multilayer chip capacitor may includes, in addition to the above-described structure, a structure in which a parallel circuit formed by connecting a capacitance C2 and a resistance Rc2 in parallel, which represent electromagnetic effects present in the dielectric contacting respective side face of the plurality of internal electrodes and the dielectric contacting the respective other side face of the plurality of internal electrodes, and a parallel circuit formed by connecting a capacitance C3 and a resistance Rc3 in parallel, which represent electromagnetic effects present in the dielectric contacting a respective open end face of the plurality of internal electrodes, are connected to the first parallel circuit in series; and a series circuit formed by connecting an inductance L2 and a resistance RL2 in series, which represent metal skin effects on both side faces of respective one of the plurality of internal electrodes, and a series circuit formed by connecting an inductance L3 and a resistance RL3 in series, which represent metal skin effects on the respective open end, face of the plurality of internal electrodes, are connected in parallel with the aforementioned third series circuit.

The circuit constant analysis method of the equivalent circuit of the multilayer chip capacitor according to one aspect of the present invention includes determining values of circuit constants included in the above-described multilayer chip capacitor equivalent circuit model such that a typical value of the relative error between the value of the inductance of the above-described multilayer chip capacitor equivalent circuit model and the actual measured value of the multilayer chip capacitor becomes smaller.

The circuit constant analysis program for the multilayer chip capacitor according to one aspect of the present invention is configured to cause a computer to perform the functions of determining multilayer chip capacitor circuit constants in accordance with the above-described circuit constant analysis method and calculating the frequency characteristics of impedance based on the circuit constants determined.

The circuit constant analysis device for the multilayer chip capacitor according to one aspect of the present invention includes a memory that stores the above-mentioned program, and a calculation processor for running the program and conducting circuit constant analysis for the multilayer chip capacitor equivalent circuit.

The circuit simulator for simulating the characteristics of a circuit containing a multilayer chip capacitor according to another aspect of the present invention includes a calculation processor that analyzes and determines the circuit constants of each of elements in the above-described equivalent circuit model in accordance with the aforementioned circuit constant analysis method, and that perform simulation on circuit characteristics of the circuit containing the multilayer chip capacitor using utilizes the circuit constants determined thereby. The above and other objects, characteristics, and advantages of the present invention will be made more apparent from the following detailed explanations and appended drawings.

Effects of the Invention

According to at least some of the aspects of the present invention, a circuit connecting the inductance L1 and the resistance RL1 in series, which represent metal skin effects on the respective upper and lower surfaces of a plurality of internal electrodes, and a circuit connecting the capacitance C1 and the resistance Rc1 in parallel, which represent the electromagnetic effects present in the dielectric contacting the upper surface and in the dielectric contacting the lower surface, respectively, the plurality of internal electrodes are included. Also, similar circuits are provided for one side face, the other side face, and the open edges of respective ones of the plurality of internal electrodes. Therefore, it is possible to successfully suppress errors that accompany frequency variations between target performance and actual performance in circuit design using a circuit simulator.

BRIEF DESCRIPTION OF THE DRAWINGS

FIGS. 2(A)-1(C) are circuit diagrams for explanation of Embodiment 2 of the present invention in which a ladder circuit is configured to take into consideration electrode thickness.

DETAILED DESCRIPTION OF EMBODIMENTS

Figure 1:
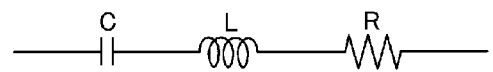
FIGS. 1(A)-1(C) are circuit diagrams showing basic equivalent circuits for a multilayer chip capacitor for explanation of Embodiment 1 of the present invention.
Figure 1:
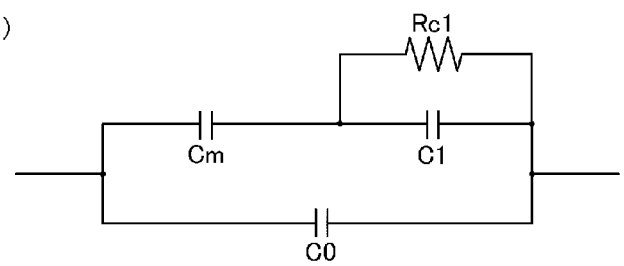
Figure 1:
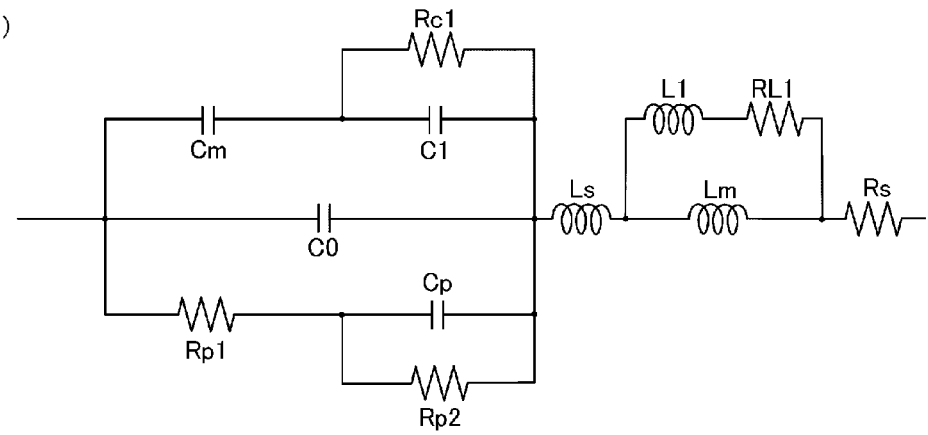

Preferred embodiments of the present invention are explained in detail below with references to drawings.

Embodiment 1

First, in order to facilitate understanding of the present invention, progression from the above-described RLC series circuit model to an equivalent circuit model of the present invention will be explained with reference to FIGS. 1(A) to 1(C). As mentioned previously, the simplest equivalent circuit of a multilayer chip capacitor is an RLC series circuit (see FIG. 1(A)) in which the equivalent series capacitance C, the equivalent series inductance L, and the equivalent series resistance R are connected in series. Each circuit element is actually frequency dependent according to the electrical characteristics of the multilayer chip capacitor. Among them, the equivalent series resistance R is especially highly frequency dependent.

Therefore, a ladder circuit shown in FIG. 1(B) is substituted for the frequency-dependent equivalent series capacitance C and for part of the equivalent series resistance R. In FIG. 1(B), the capacitance C0 is the static capacitance. The capacitances Cm and C1 and the resistance Rc1 represent electromagnetic effects occurring in the internal electrodes within the multilayer chip capacitor, and take into account abnormal characteristics of the electromagnetic field distributions that occur near the corners and edges of the electrodes. The capacitance Cm is connected in series to a parallel circuit formed by the capacitance C1 and the resistance Rc1 connected in parallel, and the capacitance C0 is connected to that structure in parallel. This configuration can supplement or represent the frequency characteristics of the frequency-dependent equivalent series capacitance C and part of the equivalent series resistance R.

Next, an equivalent circuit according to Embodiment 1 of the present invention will be explained. FIG. 1(C) shows an equivalent circuit of the present embodiment, taking into account loss and parasitic capacitance of the dielectric and the parasitic inductance of external electrodes as well as the skin effects and electromagnetic proximity effects in the plurality of external electrodes within the multilayer chip capacitor. In FIG. 1(C), the resistances (insulation resistance) Rp1 and Rp2 represent a loss in the dielectric and the capacitance Cp represents the parasitic capacitance within the dielectric material. Moreover, the inductance L1 and the resistance RL1 represents the skin effects of the plurality of internal electrodes, and the inductance Lm takes into consideration the electromagnetic proximity effects of the plurality of internal electrodes. The inductance Ls represents the parasitic inductance of the external electrodes, and the resistance Rs represents the DC resistance of the electrodes.

A first parallel circuit is constructed of the capacitance C1 and the resistance Rc1 connected in parallel. The first parallel circuit is connected in series with the capacitance Cm to form a first series circuit. A second parallel circuit is constructed of the capacitance Cp and the resistance Rp2 connected in parallel. The second parallel circuit is connected in series with the resistance Rp1 to form a second series circuit. A third parallel circuit is formed by connecting the first series circuit, the second series circuit, and the capacitance C0 in parallel. A third series circuit is constructed of the inductance L1 and the resistance RL1 connected in series. The third series circuit is connected in parallel with the inductance Lm to form a fourth parallel circuit. The fourth parallel circuit, the above-described third parallel circuit, the inductance Ls, and the resistance Rs are connected in series to construct the equivalent circuit of the present embodiment (hereafter referred to as Model 1).

Next, a simulation is explained using the equivalent circuit of the multilayer chip capacitor of the present embodiment configured in the above-described manner. When a SPICE simulator is used as the simulator, for example, the resultant SPICE file of the equivalent circuit in the above-described FIG. 1 is as follows.

```
.subckt MLCC1 1 2
    C0    1 3 Cval1
    Cm    1 6 Cval2
    C1    6 3 Cval3
    Rc1   6 3 Rval1
    Rp1   1 8 Rval2
    Rp2   8 3 Rval3
    Cp    8 3 Cval4
    Ls    3 4 Lval1
    Lm    4 5 Lval2
    L1    4 7 Lval3
    RL1   7 5 Rval4
    Rs    5 2 Rval5
.ends
```

As may be required, the product name or the copyright notice are appended as comments. Within the above file, specific numerical values are recorded for the circuit constants, such as Cval1, Cval2, .... For example, when the C0 value is 3.00870681 pF, then "C 0 13 3.00870681p" is entered. Specific examples are described below.

The program file of the SPICE model, which is written in Fortran, is listed below. Although the above-described SPICE file may be read into the SPICE simulator without modification, the program file below must be compiled. Also the product name or the copyright notice are to be appended as comments, if necessary.

Complex Function ZMLCC1(C0,Cm,C1,Rc1,Rp1,Rp2, Cp,Ls,Lm,L1,RL1,Rs,Freq)
Complex AIM,YC0,YCm,YC1,YCp,ZLs,ZLm,ZL1,Z1, Z2,Z3,AW
data PI/3.1415926/,AIM/(0.0,1.0)
AW=AIM*2.0*PI*Freq
YC0=AW*C0
YCm=AW*Cm
YC1=AW*C1
YCp=AW*Cp
ZLs=AW*Ls
ZLm=AW*Lm
ZL1=AW*L1
Z1=1./(YC0+1./(Rp1+1./(YCp+1/Rp2))+1./(1./(YC1+1./Rc1)+1./YCm)),
Z2=1./(1./(ZL1+RL1)+1./ZLm)
Z3=Rs+ZLs
ZMLCC1=Z1+Z2+Z3
Return
End Embodiment 2

Figure 2:
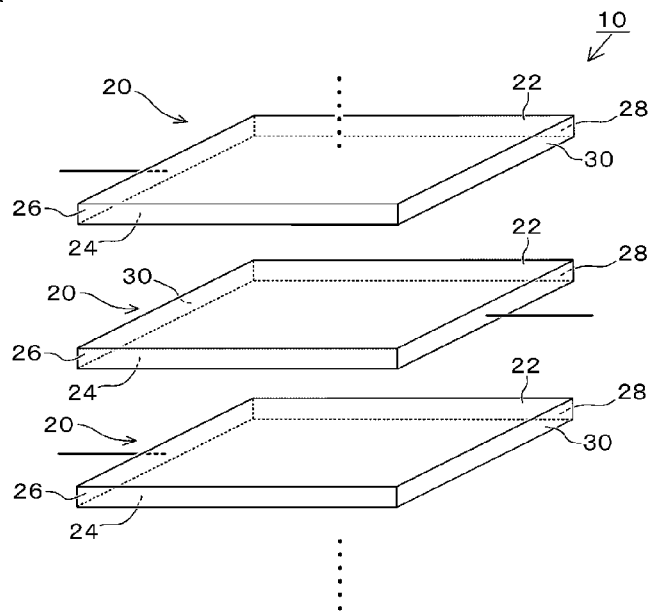
Figure 2:
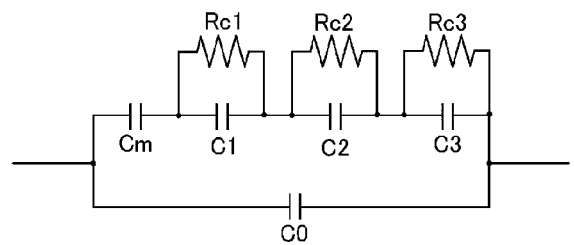
Figure 2:
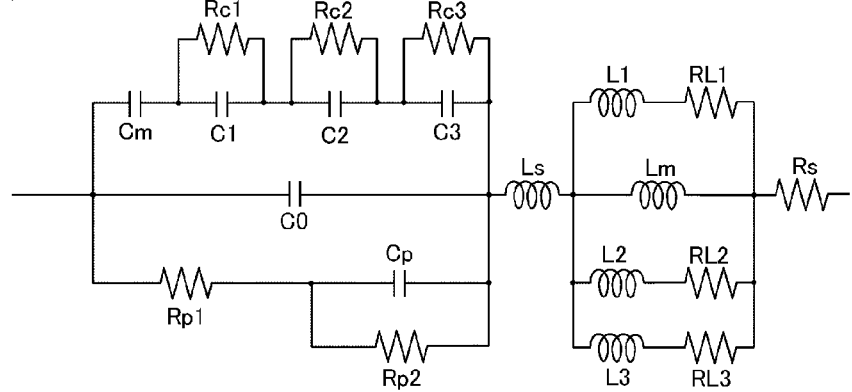

With reference to FIGS. 2(A) to 2(C), Embodiment 2 of the present invention will be explained. The present embodiment takes into account the thickness of the plurality of internal electrodes in the multilayer chip capacitor. As shown in FIG. 2(A), in the multilayer chip capacitor 10, a plurality of internal electrodes 20 are layered, and the lead wires are attached alternately. In order to obtain a more accurate equivalent circuit, in addition to the electromagnetic effects of the upper surface 22 and the lower surface 24 of the internal electrodes 20, electromagnetic effects must be considered for the side face 26, the other side face 28, and for the open end face 30 of each of the internal electrodes. Such electromagnetic effects cause abnormality in the electromagnetic distribution characteristics of the dielectric that is contacting the surface of the internal electrodes (i.e. becomes infinite), which is due to the electromagnetic proximity effect and the skin effect of the metal that occur at the surfaces of the internal electrodes.

Taking into consideration theses effects, the present embodiment uses the ladder circuit shown in FIG. 2(B) instead of the ladder circuit of FIG. 1(B). As shown in FIG.

2(B), a first parallel circuit connects the capacitance C1 and the resistance Rc1 in parallel. A second parallel circuit connects the capacitance C2 and the resistance Rc2 in parallel. A third parallel circuit connects the capacitance C3 and the resistance Rc3 in parallel. And the first, second and the third parallel circuits are connected in series. The other elements are as described previously.

Among these components, the first parallel circuit formed of the capacitance C1 and the resistance Rc1 takes into consideration the electromagnetic effects of the upper surface 22 and the lower surface 24 of each of the plurality of the internal electrodes 20, and therefore is similar to the corresponding structure of Embodiment 1. The second parallel circuit formed by the capacitance C2 and the resistance Rc2 takes into consideration the electromagnetic effects on the side face 26 and the other side face 28 of each of the plurality of the internal electrodes 20. The third parallel circuit formed by the capacitance C3 and the resistance Rc3 takes into consideration the electromagnetic effects of the open end face 30 of each of the plurality of internal electrodes 20.

In the same manner, by additionally taking into consideration the electromagnetic proximity effects and skin effects occurring on the side face 26, the other side face 28, and on the open end face 30 of each of the plurality of the internal electrodes 20, the circuit in FIG. 2(C) is obtained in place of the circuit of FIG. 1(C). In FIG. 2(C), a third series circuit is formed by connecting the impedance L1 and the resistance RL1 in series. A fourth series circuit is formed by connecting the impedance L2 and the resistance RL2 in series. A fifth series circuit is formed by connecting the impedance L3 and the resistance RL3 in series. And these third to fifths series circuits are connected in parallel. Other elements are the same as those described previously. In this manner, it becomes possible to obtain the highly accurate equivalent circuit (hereinafter referred to as Model 2) shown in FIG. 2(C) by taking into consideration the finite thickness of the internal electrodes.

An example of the SPICE file of the equivalent circuit shown in FIG. 2(C) as described above is as follows:

```
.subckt MLCC3 1 2
    C0      1 3 Cval1
    Cm      1 6 Cval2
    C1      6 7 Cval3
    Rc1     6 7 Rval1
    C2      7 8 Cval4
    Rc2     7 8 Rval2
    C3      8 3 Cval5
    Rc3     8 3 Rval3
    Rp1     1 9 Rval4
    Rp2     9 3 Rval5
    Cp      9 3 Cval6
    Ls      3 4 Lval1
    Lm      4 5 Lval2
    L1      4 10 Lval3
    RL1     10 5 Rval6
    L2      4 11 Lval4
    RL2     11 5 Rval7
    L3      4 12 Lval5
    RL3     12 5 Rval8
    Rs      5 2 Rval9
.ends
```

The above-described SPICE model program file, written in Fortran, is also listed below.

Complex Function ZMLCC2(C0,Cm,C1,Rc1,C2,Rc2,C3, Rc3,
1 Rp1,Rp2,Cp,Ls,Lm,L1,RL1,L2,RL2,L3,RL3,Rs,Freq)
    Complex  AIM,YC0,YCm,YC1,YC2,YC3,YCp,ZLs, ZLm,ZL1,ZL2,ZL3O,
    1 Z1,Z2,Z3,AW
    data PI/3.1415926/,AIM/(0.0,1.0)
    AW=AIM*2.0*PI*Freq
    YC0=AW*C0
    YCm=AW*Cm
    YC1=AW*C1
    YC2=AW*C2
    YC3=AW*C3
    YCp=AW*Cp
    ZLs=AW*Ls
    ZLm=AW*Lm
    ZL1=AW*L1
    ZL2=AW*L2
    ZL3=AW*L3
    Z1=1./(YC0+1./(Rp1+1./(YCp+1./Rp2))+1./(1./(YC1+1./Rc1)+
    1./(YC2+1./Rc2)+1./(YC3+1./Rc3)+1./YCm))
    Z2=1./(1./(ZL1+RL1)+1./(ZL2+RL2)+1./(ZL3+RL3)+1./ZLm)
    Z3=Rs+ZLs
    ZMLCC2=Z1+Z2+Z3
    Return
End

SPECIFIC EXAMPLES

Next, with reference to FIG. 3 through FIG. 6(B), specific numerical examples of the above embodiments and examples of simulations are explained. The circuit constants of the equivalent circuit need to be determined in order to perform the simulation using the equivalent circuit Models 1 and 2 of the above-described embodiments. In other words, for an individual multilayer chip capacitor (say, Model No. "XYZ," manufactured by, say, ABC Co.), the above-described circuit constants must first be specifically determined for that multilayer chip capacitor.

Although various types of techniques, such as Newton's method, are known as techniques for such determination, a method based on a global optimization algorithm is used in the explanation below as an example method. First let the following expression to be the actually measured value of the impedance at frequency $f_n$ of the subject specific multilayer chip capacitor.

$$Z\_test(f_n)=ESR\_test(f_n)+jX\_test(f_n) \quad \text{Formula A}$$

Here, "j" is an imaginary unit. Also, let the following expression to be the circuit impedance at frequency $f_n$ according to the SPICE model of this multilayer chip capacitor.

$$Z\_circuit(V,f_n)=ESR\_circuit(V,f_n)+jX\_circuit(V,f_n) \quad \text{Formula B}$$

Here, V $\{=V1, V2, \ldots, V_m\}$ and Vi (i=1, 2, ..., m) are the SPICE model circuit elements.

The optimization numerical model for the extraction of circuit constants is illustrated by the following Formula 1 or Formula 2. The target functions expressed by these formulas define the relative error between the measured value of the impedance of the subject multilayer chip capacitor and the impedance value of the SPICE model, and these functions express minimization of this relative error. Formula 1 expresses the total error for the entire band region. Formula 2 expresses the maximum error of the real part and the imaginary part of the impendence for each frequency.

$$\text{Min}\left\{\frac{\sum_{f_n}|Z\_circuit(V_1, V_2, \ldots, V_m, f_n) - Z\_test(f_n)|}{\sum_{f_n}|Z\_test(f_n)|}\right\} \quad \text{Formula 1}$$

$$\text{Min}\left\{\text{Max}_{f_n}\left\{\frac{|ESR\_circuit(V_1, V_2, \ldots, V_m, f_n)\} - ESR\_test(f_n)|}{|ESR\_test(f_n)|}, \frac{|X\_circuit(V_1, V_2, \ldots, V_m, f_n) - X\_test(f_n)|}{|X\_test(f_n)|}\right\}\right\} \quad \text{Formula 2}$$

Figure 3:
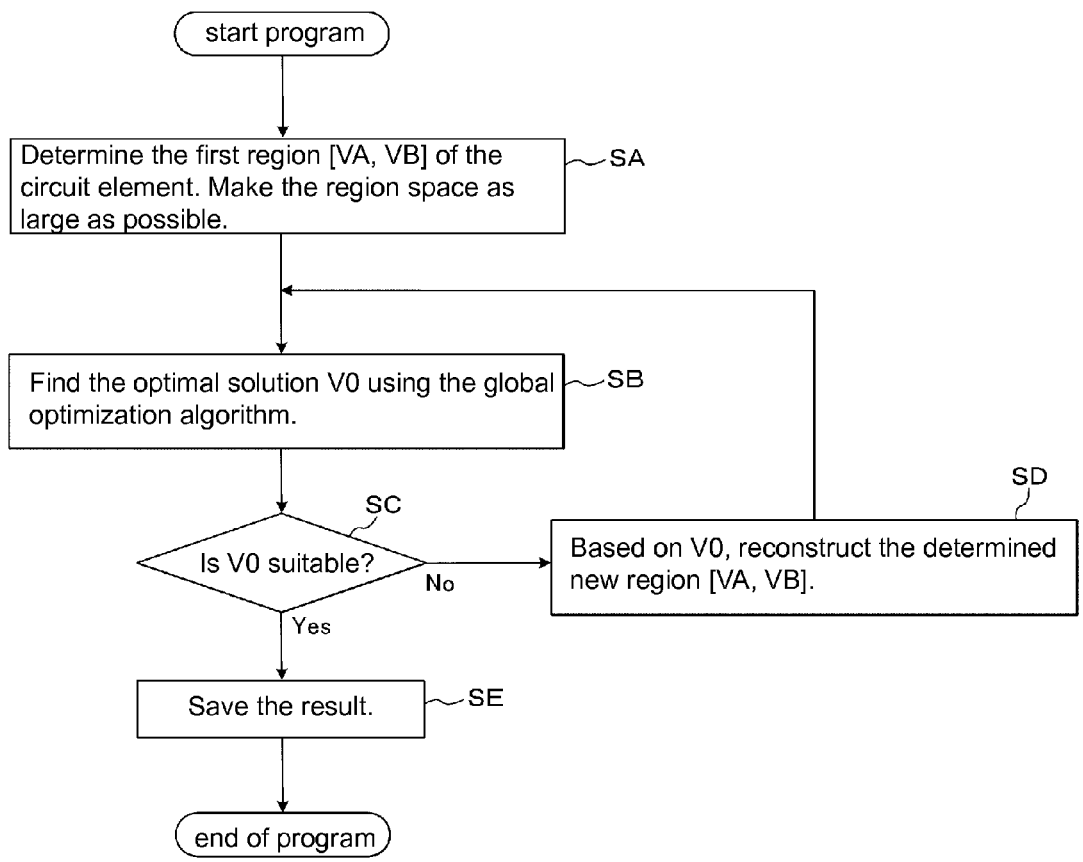
FIG. 3 is a flow chart that shows an example of a method for determining the circuit constants in the above-described equivalent circuits.
Figure 4:
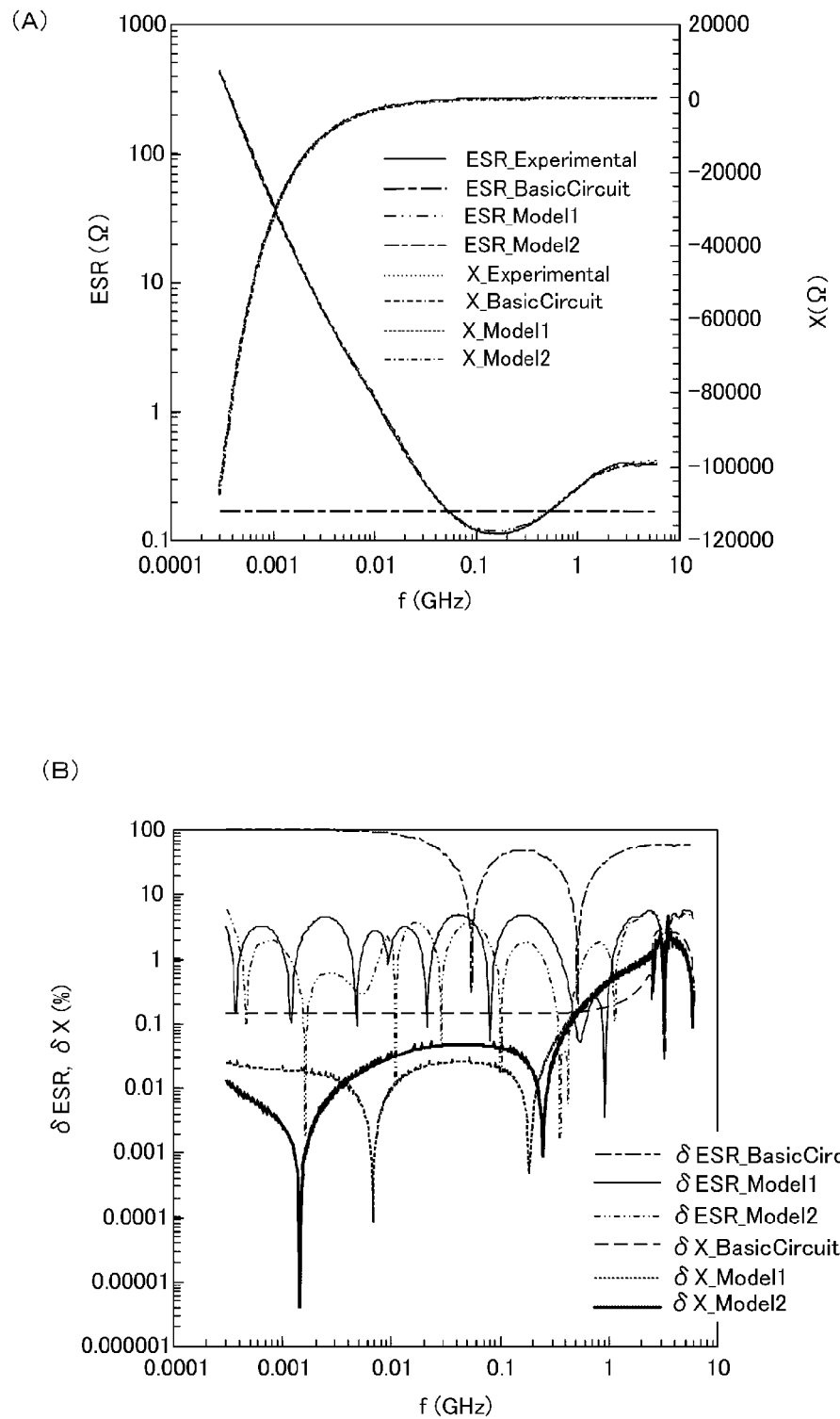
FIGS. 4(A) and 4(B) show the results of simulations using the equivalent circuits of the above-described embodiments for an actual multilayer chip capacitor having a relatively low capacitance value.
Figure 5:
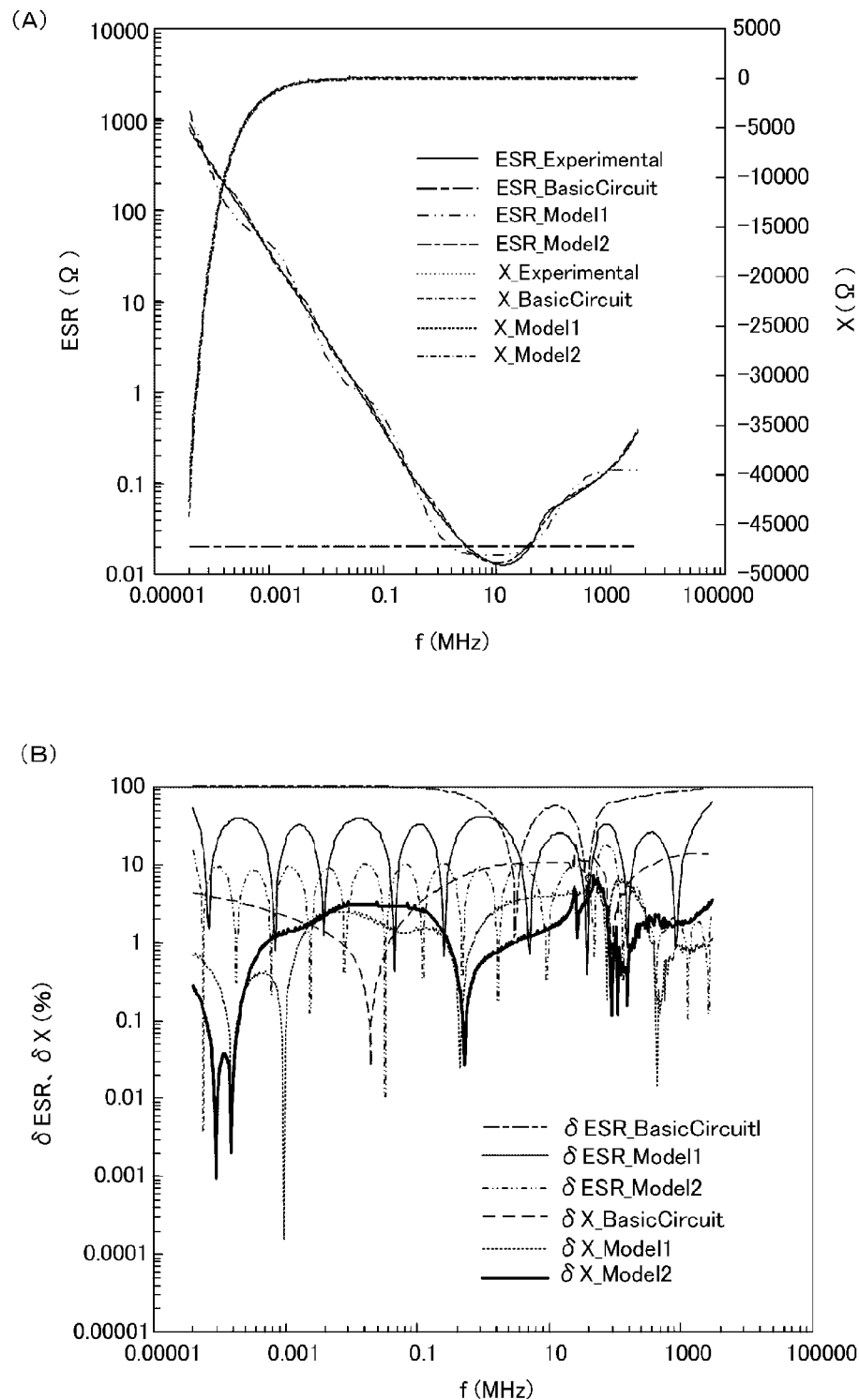
FIGS. 5(A) and 5(B) show the results of simulations using the equivalent circuits of the above-described embodiments for an actual multilayer chip capacitor having a high capacitance value.
Figure 6:
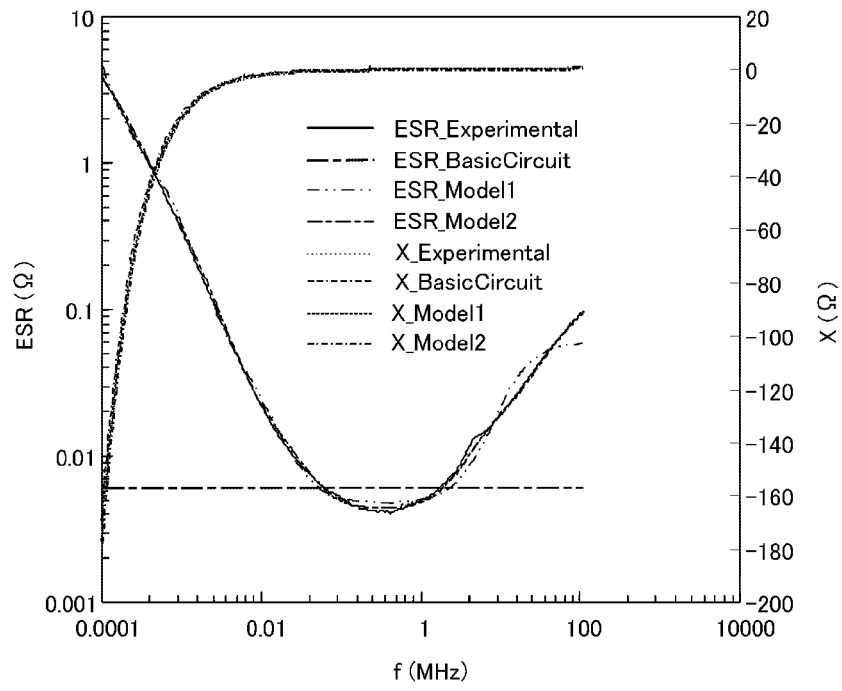
FIGS. 6(A) and 6(B) show the results of simulations using the equivalent circuits of the above-described embodiments for an actual multilayer chip capacitor having an even higher capacitance value.
Figure 6:
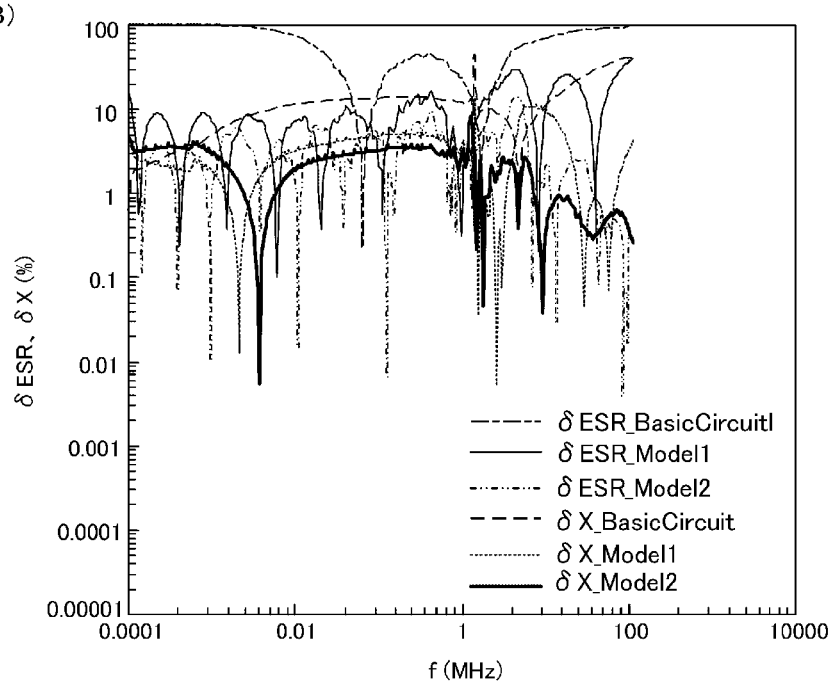

The procedure according to the aforementioned global optimization algorithm is shown in a flowchart of FIG. 3. First, as shown in FIG. 3, the initial region $[V_A, V_B]$ of the circuit element is determined (step SA). The initial region $[V_A, V_B]$ is made as large as possible so that the desired optimum solution is within the initial region $[V_A, V_B]$. Then, the global optimization algorithm can find a suitable optimum solution by single processing, thereby reducing the time required for the simulation.

Next, the optimum solution V0 is obtained using the global optimization algorithm (step SB). Then the above-described Formula 1 and Formula 2 are used to determine the error in circuit impedance, and a determination is made as to whether or not the optimum solution V0 is suitable (step SC). If the error between the actual measured values for the multilayer chip capacitor and the circuit impedance of the SPICE model is determined to be impermissibly large, the optimum solution V0 is considered inappropriate (the result of step SC is NO). In this case, the solution V0 is used to construct a new region $[V_A, V_B]$ (step SD), and another optimum solution V0 is again sought using the global optimization algorithm (step SB).

The error between the circuit impedance according to the SPICE model and the actual measured value of the impedance represents the accuracy of the SPICE model. The relative errors with respect to the actual measured values of the circuit impedance are expressed by the following Formula 3 and Formula 4. Among these formulas, Formula 3 expresses the ESR relative error, and Formula 4 expresses the reactance relative error.

$$\delta ESR(f_n) = \left\{\frac{|ESR\_circuit(V_1, V_2, \ldots, V_m, f_n] - |}{ESR\_test(f_n)|}\right\}(\%) \quad \text{Formula 3}$$

$$\delta X(f_n) = \left\{\frac{|X\_circuit(V_1, V_2, \ldots, V_m, f_n) - |}{X\_test(f_n)|}\right\}(\%) \quad \text{Formula 4}$$

The above described processing is repeatedly performed, and when the "typical value" of the relative errors of the circuit impedance with respect to the actually measured values becomes less than or equal to a target value (e.g., less than or equal to 10%), a determination will be made that a highly accurate SPICE model has been obtained (i.e. the result of step SC is YES). Then the result is saved, and the process ends (step SE).

A multilayer chip capacitor has an extremely high ratio of impedance reactance X to equivalent series resistance ESR (X/ESR) on the low frequency side. Depending on measurement instruments used for the measurement, the accuracy of the ESR measurement values could be extremely poor relative to the high degree of accuracy for the measurement of the reactance X. Moreover, noise is generated during the measurements by the measurement instruments, and therefore, the resultant measured values include the noise components. This noise is about ±10%. In addition, there is a great variance among individual multilayer chip capacitors. The tolerance for multilayer chip capacitor is specified to be the J tolerance (±5%) for general multilayer ceramic capacitors (temperature compensated type), ultra-low distortion ceramic capacitors, and for high frequency ceramic capacitors. For other types, the K tolerance (±10%) or the M tolerance (±20%) is applied. Accordingly, the "typical value" of the relative error in the circuit impedance for a highly accurate SPICE model preferably is less than or equal to 10% for the J tolerance products, and less than or equal to 15% for the K tolerance products and M tolerance products.

To verify the above-described equivalent circuit model, SPICE models were obtained for multiple multilayer chip capacitors. The target multilayer chip capacitor products were a general multilayer ceramic capacitor (Class 1, temperature compensated type), a general multilayer ceramic capacitor (Class 2, high dielectric coefficient type), a multilayer ceramic capacitor for high frequency use, an ultra-low distortion multilayer ceramic capacitor, and a high capacity multilayer ceramic capacitor. It was determined as a result of such verification that all product SPICE models agreed extremely well with the actually measured data for the actual multilayer ceramic capacitors in a wide band region. High accuracy was obtained even for the Model 1 equivalent circuit with respect to the low capacitance multilayer ceramic capacitor. Although the accuracy using the Model 1 equivalent circuit was slightly lower with respect to a large capacitance multilayer ceramic capacitor, the accuracy was found to be greatly improved when the Model 2 equivalent circuit was used. Representative examples using three multilayer ceramic capacitors manufactured by Taiyo Yuden Co., Ltd. will be described below in detail.

(A) Multilayer Ceramic Capacitor "UMK105CH050 (5 pF)" Class 1

The circuit constants of the equivalent circuits were as follows. They are for the 300 kHz to 6 GHz frequency range at room temperature and without DC bias.

First, the following results were obtained using the above-described method for the values of the circuit constants in case of using the basic equivalent circuit shown in FIG. 1(A).
C=4.93325138 pF
L=0.464808911 nH
R=0.167322427 Ω

The circuit constants of the equivalent circuit Model 1 of the Embodiment 1 shown in FIG. 1(C) were obtained as follows:
C0=3.00870681 pF
Cm=3.92837548 pF
C1=3.7405591 pF
Rc1=7202.6935 kΩ
Ls=0.0288861934 nH
Rs=0.104859829 Ω
Lm=0.48061493 nH
L1=4.30294275 nH
RL1=31.4885731 Ω
Rp1=8105.667 kΩ
Rp2=54.898688 GΩ
Cp=0.00244404329 pF The circuit constants of the equivalent circuit Model 2 of Embodiment 2 shown in FIG. 2(C) were obtained as follows:
C0=3.9467504 pF
Cm=1.99481005818 pF
C1=1.92191601 pF Rc1=7.3327831752 MΩ
C2=537.584838791 pF
Rc2=26.571081839 Ω
C3=5677.255716 pF
Rc3=1940.5187538 Ω
Ls=0.01834981398642 nH
Rs=0.09982694501712 Ω
Lm=0.494221687 nH
L1=4.28829861 nH
RL1=29.8570557 Ω
L2=5.99605989 nH
RL2=37.9544725 mΩ
L3=3.00039339 nH
RL3=2.172284532 MΩ
Rp1=52.59297555072 MΩ
Rp2=76.23516519333 GΩ
Cp=0.0010273870248478 pF The SPICE files corresponding to Model 1 and Model 2 are as listed below. Comment lines are omitted.

a. Model 1

```
.subckt UMK105CH050_1 1 2
    C0      1 3 3.00870681p
    Cm      1 6 3.92837548p
    C1      6 3 3.7405591p
    Rc1     6 3 7202.6935k
    Rp1     1 8 8105.667k
    Rp2     8 3 54.898688G
    Cp      8 3 0.00244404329p
    Ls      3 4 0.0288861934n
    Lm      4 5 0.48061493n
    L1      4 7 4.30294275n
    RL1     7 5 31.4885731
    Rs      5 2 0.104859829
.ends
``` b. Model 2

```
.subckt UMK105CH050_2 1 2
    C0      1 3 3.9467504p
    Cm      1 6 1.99481005818p
    C1      6 7 1.92191601p
    Rc1     6 7 7.3327831752MEG
    C2      7 8 537.584838791p
    Rc2     7 8 26.571081839
    C3      8 3 5677.255716p
    Rc3     8 3 1940.5187538
    Rp1     1 9 52.59297555072MEG
    Rp2     9 3 76.23516519333G
    Cp      9 3 0.0010273870248478p
    Ls      3 4 0.01834981398642n
    Lm      4 5 0.494221687n
    L1      4 10 4.28829861n
    RL1     10 5 29.8570557
    L2      4 11 5.99605989n
    RL2     11 5 37.9544725MEG
    L3      4 12 3.00039339n
    RL3     13 5 2.172284532MEG
    Rs      5 2 0.09982694501712
.ends
```

The program for calling up the programmed SPICE model is as follows. Comments are omitted.

a. Model 1
  Complex Function Z_050_1(Freq)
  Complex ZMLCC1
  C0=3.00870681e-12
  Cm=3.92837548e-12
  C1=3.7405591e-12
  Rc1=7202.6935e3
  Rp1=8105.667e3
  Rp2=54.898688e9
  Cp=0.00244404329e-12
  Ls=0.0288861934e-9
  Lm=0.48061493e-9
  L1=4.30294275e-9
  RL1=31.4885731
  Rs=0.104859829
  Z_050_1=ZMLCC1(C0,Cm,C1,Rc1,Rp1,Rp2,Ls,Lm,L1,RL1,Rs,Freq)
  Return
End b. Model 2
  Complex Function Z_050_2(Freq)
  COMPLEX ZMLCC2
  C0=3.9467504e-12
  Cm=1.99481005818e-12
  C1=1.92191601e-12
  Rc1=7.3327831752e6
  C2=537.584838791e-12
  Rc2=26.571081839
  C3=5677.255716e-12
  Rc3=1940.5187538
  Rp1=52.59297555072e6
  Rp2=76.23516519333e9
  Cp=0.0010273870248478e-12
  Ls=0.018349813986342e-9
  Lm=0.494221687e-9
  L1=4.28829861e-9
  RL1=29.8570557
  L2=5.99605989e-9
  RL2=37.9544725e6
  L3=3.00039339e-9
  RL3=2.172284532e6
  Rs=0.09982694501712
  Z_050_2=ZMLCC2(C0,Cm,C1,Rc1,C2,Rc2,C3,Rc3,
    1 Rp1,Rp2,Cp,Ls,Lm,L1,RL1,L2,RL2,L3,RL3,Rs,Freq)
  Return
End Next, the results of calculations by the SPICE simulator using the circuit constants of Model 1 and Model 2 obtained in the above-described manner and the results of the SPICE simulator of the basic circuit shown in FIG. 1(A) were compared to actual measured impedance values.

FIG. 4(A) is a graph showing the frequency characteristics for ESR (equivalent series resistance) and X (reactance). In the figure, the frequency is plotted along the horizontal axis, and the values of ESR and X are plotted along the vertical axis. The "experimental" solid line curve shows actual measured values. The "basic circuit" curve shows results for the basic circuit. The "Model 1" curve shows results for the equivalent circuit of Model 1 in FIG. 1(C). The "Model 2" curve shows results for the equivalent circuit of Model 2 in FIG. 2(C). As shown in these figures, both Model 1 and Model 2 approximated the actual measured values extremely well, showing that both of these models have extremely high accuracy.

FIG. 4(B) shows the respective relative errors of ESR and X with respect to the actual measured values for Model 1, Model 2, and the basic circuit. As shown in the figure, the equivalent circuits of Model 1 and Model 2 had very small errors in comparison to the basic circuit, indicating that Model 1 and Model 2 were both highly accurate.

(B) Multilayer Ceramic Capacitor "LMK105BJ104 (100 nF)"

In comparison to the above example, the capacity of this capacitor is roughly 20,000 times higher. The circuit constants of the equivalent circuits were as follows, for an applicable frequency range of 40 kHz to 3 GHz at room temperature and without DC bias.

First, the following results were obtained when the numerical values of the circuit constants of the basic equivalent circuit shown in FIG. 1(A) were calculated.

C=89.9078438 nF
L=0.477196515 nH
R=0.0198914502 Ω

The circuit constants of the equivalent circuit Model 1 of Embodiment 1 shown in FIG. 1(C) for this capacitor were determined as follows:

C0=83.6392969 nF
Cm=4.66933203 nF
C1=33.8231964 pF
Rc1=341.446442 Ω
Ls=0.0508201979 nH
Rs=0.0153297028 Ω
Lm=0.464667767 nH
L1=1.6764729 nH
RL1=2.67282844 Ω
Rp1=21.0695625 kΩ
Rp2=1539.72775 kΩ
Cp=4.80782568 nF

Next, the circuit constants of the equivalent circuit Model 2 of Embodiment 2 shown in FIG. 2(C) for this capacitor were determined as follows.

C0=81.4033672 nF
Cm=8.90467383 nF
C1=0.0236405972 pF
Rc1=62.131218 Ω
C2=5.06878516 nF
Rc2=3.2561145 kΩ
C3=19.4931113 nF
Rc3=16.9028672 kΩ
Ls=0.0195942447 nH
Rs=0.0117002334 Ω
Lm=0.516070485 nH
L1=3.86673999 nH
RL1=181.950104 Ω
L2=1.81303155 nH
RL2=1.42072558 MΩ
L3=14.6117744 nH
RL3=79.1412582 Ω
Rp1=845.107483 Ω
Rp2=2.44012475 MΩ
Cp=3.1665105 nF

Among these models, the SPICE file corresponding to Model 2 is as follows. Comment lines are omitted. Due to its low accuracy, as we will describe later, the entry for Model 1 is not shown. Similarly, the program for calling up the SPICE model is not shown for Model 1.

```
.subckt LMK105BJ104 1 2
    C0    1 3 81.4033672n
    Cm    1 6 8.90467383n
    C1    6 7 0.0236405972p
    Rc1   6 7 62.131218
    C2    7 8 5.06878516n
    Rc2   7 8 3.2561145k
    C3    8 3 19.4931113n
    Rc3   8 3 16.9028672k
    Rp1   1 9 845.107483
    Rp2   9 3 2.44012475MEG
    Cp    9 3 3.1665105n
    Ls    3 4 0.0195942447n
    Lm    4 5 0.516070485n
    L1    4 10 3.86673999n
    RL1   10 5 181.950104
    L2    4 11 1.81303155n
    RL2   11 5 1.42072558
    L3    4 12 14.6117744n
    RL3   13 5 79.1412582
    Rs    5 2 0.0117002334
.ends
```

The program for calling up the programmed SPICE model is listed below. Comment lines are omitted.

```
Complex Function Z_104_2(Freq)
COMPLEX ZMLCC2
C0=81.4033672e-9
Cm=8.90467383e-9
C1=0.0236405972e-12
Rc1=62.131218
C2=5.06878516e-9
Rc2=3256.1145
C3=19.4931113e-9
Rc3=16.9028672e3
Rp1=845.107483
Rp2=2.44012475e6
Cp=3.1665105e-9
Ls=0.0195942447e-9
Lm=0.516070485e-9
L1=3.86673999e-9
RL1=181.950104
L2=1.81303155e-9
RL2=1.42072558
L3=14.6117744e-9
RL3=79.1412582
Rs=0.0117002334
Z_104_2=ZMLCC2(C0,Cm,C1,Rc1,C2,Rc2,C3,Rc3,
1 Rp1,Rp2,Cp,Ls,Lm,L1,RL1,L2,RL2,L3,RL3,Rs,Freq)
Return
End
```

FIG. 5(A) shows the frequency characteristics of ESR (equivalent series resistance) and X (reactance). The relative errors of ESR and X relative to the actual measured values are shown in FIG. 5(B). As evident from these figures, Model 2 better approximated the measured values than Model 1 for the multilayer ceramic capacitor of the present example, and Model 2 displayed high accuracy. The number of stacked layers increased due to the high capacitance of the capacitor, and the dielectric became thinner. It is believed that, the thickness of the electrodes became relatively large so that results were affected by the side faces of the electrodes or the like.

(C) Multilayer Ceramic Capacitor "GMK316BJ106 (10 pF)"

In comparison to the above-described Example B, the capacity of this capacitor is another 100-times greater. The circuit constants of the equivalent circuits were as follows for an applicable frequency range of 100 Hz to 110 MHz at room temperature and without DC bias.

First, the values for the circuit constants of the basic equivalent circuit shown in FIG. 1(A) were determined as follows:

C=9.399774 μF
L=1.44098794 nH
R=0.00600963226 Ω

The circuit constants of the equivalent circuit Model 1 of Embodiment 1 shown in FIG. 1(C) for this capacitor were determined as follows:

C0=8.549285 μF
Cm=0.133352078 μF
C1=5.26498175 pF
Rc1=113.886116 Ω
Ls=0.23356232 nH
Rs=0.00471188826 Ω
Lm=1.36378956 nH
L1=1.9533869 nH
RL1=0.319902778 Ω
Rp1=686.746887 Ω
Rpt=7.95768896 Ω
Cp=0.372943531 μF

The circuit constants of the equivalent circuit Model 2 of Embodiment 2 shown in FIG. 2(C) for this capacitor were determined as follows:

C0=8.409048 μF
Cm=0.314550.094 μf
C1=2.755476 μF
Rc1=4.12212038 Ω
C2=277.556335 pF
Rc2=58.4974747 Ω
C3=0.267274031 μF
Rc3=157.866211 Ω
Ls=0.130296141 nH
Rs=0.00436108653 Ω
Lm=1.51660061 nH
L1=3.64575338 nH
RL1=1.36221182 Ω
L2=4.10134459 nH
RL2=0.20093511 Ω
L3=2.32526946 nH
RL3=17.3404484 Ω
Rp1=2.36281958 kΩ
Rp2=20.4238203 kΩ
Cp=0.344478062 μF

Among these models, the SPICE file corresponding to Model 2 is as follows below. Comment lines are omitted.

.subckt GMK316BJ106 1 2
C0 1 3 8.409048u
Cm 1 6 0.314550094u
C1 6 7 2.755476u
Rc1 6 7 4.12212038
C2 7 8 277.556335p
Rc2 7 8 58.4974747
C3 8 3 0.267274031u
Rc3 8 3 157.866211
Rp1 1 9 2.36281958 k
Rp2 9 3 20.4238203 k
Cp 9 3 0.344478062u
Ls 3 4 0.130296141n
Lm 4 5 1.51660061n
L1 4 10 3.64575338n
RL1 10 5 1.36221182
PL2 4 11 4.10134459n
RL2 11 5 0.20093511
L3 4 12 2.32526946n
RL3 13 5 17.3404484
Rs 5 2 0.00436108653
.ends The program for calling up the programmed SPICE model is shown below. Comment lines are omitted.

Complex Function Z_1062(Freq)
COMPLEX ZMLCC2
C0=8.409048e-6
Cm=0.314550094e-6
C1=2.755476e-6
Rc1=4.12212038
C2=277.556335e-12
Rc2=58.4974747
C3=0.267274031e-6
Rc3=157.866211
Rp1=2362.81958
Rp2=20.4238203e3
Cp=0.344478062e-6
Ls=0.130296141e-9
Lm=1.51660061e-9
L1=3.64575338e-9
RL1=1.36221182
L2=4.10134459e-9
RL2=0.20093511
L3=2.32526946e-9
RL3=17.3404484
Rs=0.00436108653
Z_106_2=ZMLCC2(C0,Cm,C1,Rc1,C2,Rc2,C3,Rc3,
1 Rp1,Rp2,Cp,Ls,Lm,L1,RL1,L2,RL2,L3,RL3,Rs,Freq)
Return
End Similar to the aforementioned examples, FIG. 6(A) plots the frequency characteristics of ESR (equivalent series resistance) and X (reactance), and FIG. 6(B) shows the relative errors of ESR and X compared to actual measured values. As evident from these figures, Model 2 also displayed higher accuracy than Model 1 for the multilayer ceramic capacitor of the present example.

Embodiment 3

Figure 7:
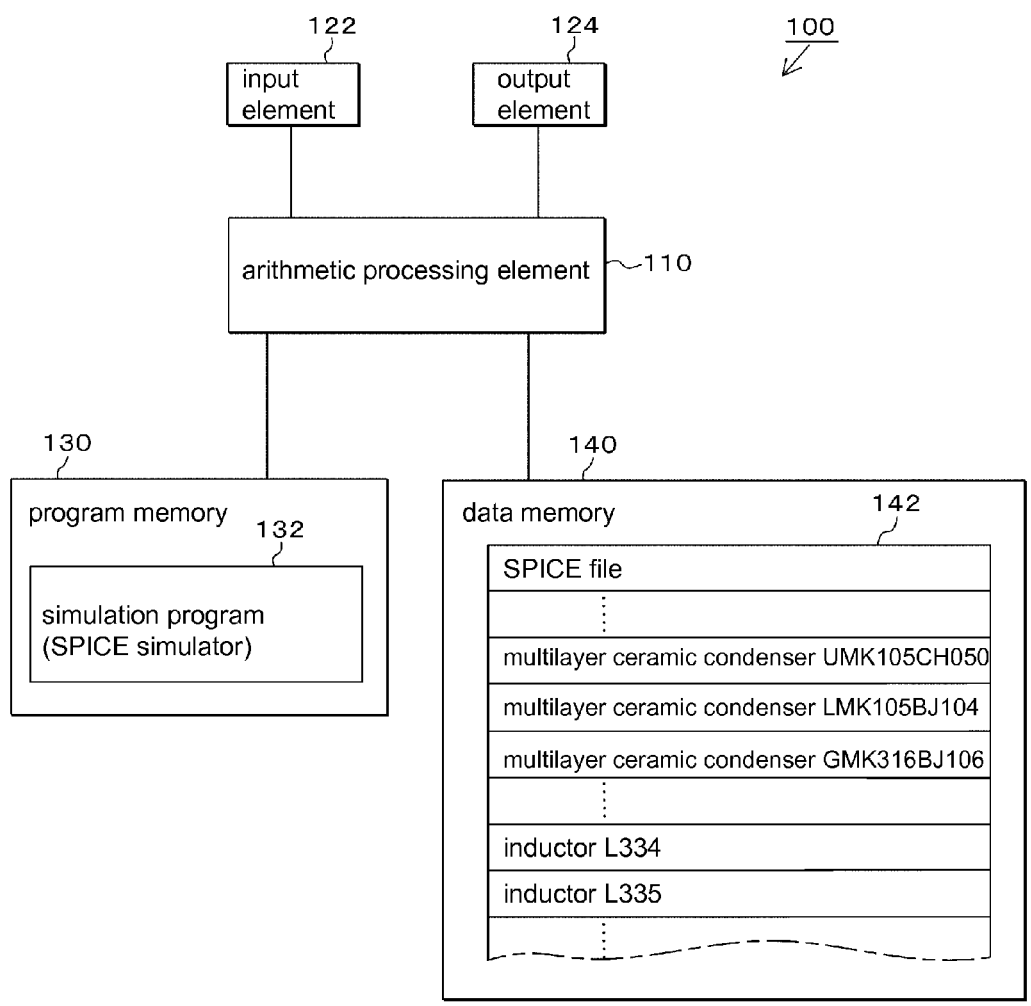
FIG. 7 is a block diagram that shows an example of a simulation apparatus according to one aspect of the present invention.

An embodiment of the present invention directed to a simulation apparatus is explained with reference to FIG. 7. A simulation apparatus 100 of the present embodiment may be constructed of a general-purpose computer system including of an input element 122 (such as a keyboard), an output element 124 (such as a liquid crystal display or the like), a program memory 130, and a data memory 140, which are connected to an arithmetic processing element 110 that is made of a CPU at its core. The simulation program, e.g., the SPICE simulator 132, is contained in the program memory 130. In addition to that, the data memory 140 contains the SPICE files 142 including the above-described multilayer chip capacitors as well as the SPICE files for various types of other electronic components such as inductors.

In response to input instructions from the input element 122, the arithmetic processing element 110 reads out, from the data memory 140, the SPICE files of the electronic components included in the circuit subject to a simulation, incorporates these files into the SPICE simulator 132, and perform an arithmetic processing of the simulation, such as simulation of circuit characteristics. A very accurate simulation result can be obtained by using the SPICE file of the equivalent circuit of the above-described Embodiment 1 or Embodiment 2 in case of multilayer chip capacitors.

By way of example, the following advantages can be realized according to the embodiments of the present invention.

(1) An electronic component manufacturer and its representative trading company are able to provide a SPICE model of the multilayer chip capacitor to customers based on the above-described equivalent circuit model. Moreover, the SPICE model can be disclosed on the company webpage in order to facilitate circuit design by customers using the company's product.

(2) An electronic component manufacturer and its representative trading company can increase the sales channels for the products of the company by loading the SPICE file or program of the SPICE model for multilayer chip capacitors into a commercial SPICE simulator. Or, the SPICE file or program can be disclosed on the company webpage so that the customer can download the SPICE file or program.

(3) By using the above-described disclosed SPICE models, an electronic component manufacturer and electronic circuit design company can design electronic products with high accuracy and can greatly reduce the time required for design. It is also possible to perform acceptance verification of multilayer chip capacitors, analysis of equipment failures, and the like.

Note that the present invention is not limited to the above-described embodiments, and various modifications may be made within a scope that does not depart from the spirit of the present invention. Examples of such modification are described below.

(1) The values of the equivalent circuit constants expressed in the above-described embodiments are sample values, and different values will result with different circuit voltage utilized, temperature conditions, and with different components.

(2) The above-described embodiments are examples in which the present invention was applied to the SPICE simulator. However, various other types of simulators may be used.

(3) Moreover, in the above-described equivalent circuits, capacitance elements having an extremely low capacitance value, resistance elements having an extremely high resistance value, and inductance elements having an extremely high inductance value may each be replaced by an open circuit. Moreover, capacitance elements having an extremely large capacitance value, resistance elements having an extremely low resistance value, and inductance elements having an extremely low inductance value may each be replaced by a short circuit. If, for example, the width of the internal electrode is very small compared to the length of the internal electrode, it is possible to ignore the electromagnetic effects on the open end face of the internal electrode. In such a case, in the equivalent circuit model of Embodiment 2, it is possible to omit the inductance L3 and the resistance RL3 as well as the capacitance C3 and the resistance Rc3 that represent the electromagnetic effects of the open end face of the internal electrodes. That is to say, the resistance Rc3 is short-circuited and the resistance RL3 is made open.

(4) Although a MLCC (multilayer ceramic capacitor) was mainly cited as the multilayer chip capacitor, the present invention is suitable for use in any types of multilayer chip capacitor.

INDUSTRIAL APPLICABILITY

The present invention is suited for various types of circuit simulations that include multilayer chip capacitors because the characteristics of multilayer chip capacitors are accurately expressed.

What is claimed is:

1. A circuit simulator for simulating characteristics of a circuit including a multilayer capacitor, comprising a processor configured to perform a circuit analysis method that comprises:
    determining an equivalent circuit for the multilayer capacitor to be one of a first equivalent circuit and a second equivalent circuit, the first equivalent circuit including:
        a first parallel circuit connecting a capacitance (C1) and a resistance (Rc1);
        a first series circuit connecting the first parallel circuit in series with a capacitance (Cm);
        a second parallel circuit connecting a capacitance (Cp) in parallel with a resistance (Rp2);
        a second series circuit connecting a resistance (Rp1) in series with the second parallel circuit;
        a third parallel circuit connecting the first series circuit, the second series circuit, and a capacitance (C0) in parallel;
        a third series circuit connecting an inductance (L1) and a resistance (RL1) in series; and
        a fourth parallel circuit connecting an inductance (Lm) in parallel to the third series circuit,
        wherein the third parallel circuit, an inductance (Ls), the fourth parallel circuit, and a resistance (Rs) are connected in series,
    the second equivalent circuit including:
        a first parallel circuit connecting a resistance (Rc1) and a capacitance (C1) in parallel;
        a second parallel circuit connecting a capacitance (C2) and a resistance (Rc2) in parallel;
        a third parallel circuit connecting a capacitance (C3) and a resistance (Rc3) in parallel;
        a first series circuit connecting the first parallel circuit, the second parallel circuit, the third parallel circuit, and a mutual capacitance (Cm) in series;
        a fourth parallel circuit connecting a capacitance (Cp) in parallel with a resistance Rp2;
        a second series circuit connecting a resistance (Rp1) in series with the fourth parallel circuit;
        a fifth parallel circuit connecting the first series circuit, the second series circuit, and a capacitance (C0) in parallel;
        a third series circuit connecting an inductance (L1) and a resistance (RL1) in series;
        a fourth series circuit connecting an inductance (L2) and a resistance (RL2) in series;
        a fifth series circuit connecting an inductance (L3) and a resistance (RL3) in series; and
        a sixth parallel circuit connecting the third series circuit, the fourth series circuit, the fifth series circuit, and an inductance (Lm) in parallel,
        wherein the fifth parallel circuit, an inductance (Ls), the sixth parallel circuit, and a resistance (Rs) are connected in series;
    determining optimum circuit constants of the equivalent circuit using actually measured characteristics of the multilayer capacitor; and
    calculating frequency characteristics of the equivalent circuit in accordance with the determined optimum circuit constants for the equivalent circuit.

* * * * *